(12) United States Patent
Vangilbergen et al.

(10) Patent No.: US 8,903,541 B2
(45) Date of Patent: Dec. 2, 2014

(54) METHOD AND ARRANGEMENT FOR POSITIONING ELECTRONIC DEVICES INTO COMPARTMENTS OF AN INPUT MEDIUM AND OUTPUT MEDIUM

(75) Inventors: Bert Vangilbergen, Tienen (BE); Jimmy Vermeulen, Sint-Agatha-Berchem (BE); Carl Truyens, Rotselaar (BE); Erik De Block, Heverlee (BE); Bruno Accou, Linter (BE)

(73) Assignee: KLA—Tencor Corporation, Milpitas, CA (US)

( * ) Notice: Subject to any disclaimer, the term of this patent is extended or adjusted under 35 U.S.C. 154(b) by 221 days.

(21) Appl. No.: 13/376,228

(22) PCT Filed: Mar. 30, 2011

(86) PCT No.: PCT/IB2011/051358
§ 371 (c)(1),
(2), (4) Date: Dec. 5, 2011

(87) PCT Pub. No.: WO2012/001539
PCT Pub. Date: Jan. 5, 2012

(65) Prior Publication Data
US 2012/0197432 A1    Aug. 2, 2012

Related U.S. Application Data

(60) Provisional application No. 61/360,411, filed on Jun. 30, 2010.

(51) Int. Cl.
*G06F 7/00* (2006.01)
*H05K 13/02* (2006.01)
*G01B 11/03* (2006.01)

(52) U.S. Cl.
CPC .............. *H05K 13/021* (2013.01); *G01B 11/03* (2013.01)
USPC ......... 700/217; 382/151; 72/31.1; 414/752.1; 29/833

(58) Field of Classification Search
USPC ........................................................ 700/217
See application file for complete search history.

(56) References Cited

U.S. PATENT DOCUMENTS 4,135,630 A * 1/1979 Snyder et al. ................. 414/627
5,867,897 A    2/1999 Mimura et al.
(Continued)

FOREIGN PATENT DOCUMENTS

EP    1608212 A2    12/2005
JP    H04-069997 A    3/1992
(Continued)

*Primary Examiner* — Gene Crawford
*Assistant Examiner* — Kyle Logan
(74) *Attorney, Agent, or Firm* — Suiter Swantz pc llo

(57) ABSTRACT

A method for positioning electronic devices into compartments of an input medium is disclosed. At least one electronic device is packable in a single compartment of the input medium. Known positions on an upper side of the input medium are imaged by an inspection device. Actual position data of the compartments of the input medium are calculated on the basis of images of the known positions, given target position data of the known positions, and given target position data of the compartments of the input medium. A pick and place device for the electronic devices is controlled on the basis of the calculated actual position data of the compartments of the input medium. A method for determining the actual positions of compartments of an output medium is disclosed with analogous steps, whereby the electronic devices are picked-up from compartments of the input medium, transferred to compartments of the output medium, and placed into the compartments of the output medium. Arrangements for positioning a plurality of electronic devices into compartments of an input medium and compartments of an output medium are also disclosed.

18 Claims, 4 Drawing Sheets

(56) References Cited

U.S. PATENT DOCUMENTS

| | | | |
|---|---|---|---|
| 5,950,802 A | | 9/1999 | Kubota |
| 5,988,971 A | * | 11/1999 | Fossey et al. ............ 414/416.01 |
| 2004/0206145 A1 | * | 10/2004 | Akami et al. .................. 72/31.1 |
| 2006/0000086 A1 | * | 1/2006 | Takemura et al. .............. 29/833 |
| 2006/0133662 A1 | * | 6/2006 | Bachthaler et al. ........... 382/151 |
| 2009/0316529 A1 | | 12/2009 | Huuskonen et al. |
| 2010/0172734 A1 | * | 7/2010 | Cheng et al. ............... 414/752.1 |
| 2011/0295414 A1 | * | 12/2011 | Lambert ...................... 700/217 |

FOREIGN PATENT DOCUMENTS

| | | |
|---|---|---|
| JP | H9-162598 A | 6/1997 |
| JP | H10-335889 A | 12/1998 |
| JP | 2000-117592 A | 4/2000 |
| JP | 2001-244696 A | 9/2001 |
| JP | 2002-076695 A | 3/2002 |
| JP | 2004-182293 A | 7/2004 |
| JP | 2007-007768 A | 1/2007 |
| JP | 2009-154889 A | 7/2009 |

* cited by examiner

METHOD AND ARRANGEMENT FOR POSITIONING ELECTRONIC DEVICES INTO COMPARTMENTS OF AN INPUT MEDIUM AND OUTPUT MEDIUM

CROSS REFERENCE TO RELATED APPLICATIONS

This patent application claims priority of U.S. Patent Application No. 61/360,411, filed on Jun. 30, 2010, the entire contents of which are incorporated herein by reference.

TECHNICAL FIELD

The present invention relates to a method for positioning electronic devices into compartments of an input medium.

The present invention also relates to a method for positioning electronic devices into compartments of an output medium.

The present invention also relates to an arrangement for positioning a plurality of electronic devices in compartments of an input medium.

The present invention also relates to an arrangement for positioning a plurality of electronic devices in compartments of an input medium and output medium.

BACKGROUND ART

Electronic devices, for example electronic components or integrated circuits (ICs), are often transported in trays during production, whereby a single electronic device is packable in a single compartment (pocket) of the tray. Once the electronic devices are picked-up from the tray they are placed and packaged in compartments (pockets) of a tape. In particular, at least one electronic device is picked-up from a respective at least one compartment of the tray, transferred to a respective at least one compartment of a tape, and then placed into the respective at least one compartment of the tape. The steps of picking-up, transferring and placing are carried out by a pick and place device, whereby a single electronic device is packable in a single compartment of the tray or tape respectively. This process of transferring electronic devices from a tray to a tape is referred to as "taping a tray". More generally, electronic devices are transferred from an input medium to an output medium. Hereby, "taping a tray" is only one possible type of transfer, the tray being the input medium and the tape being the output medium. In general, the input medium can be a tray or a tape, and the output medium can also be a tray or a tape. Even more generally, the input and output medium can be any kind of media or arrangement of compartments or pockets suitable for receiving, storing and containing electronic devices. In the following, the terms "compartment" and "pocket" are used in the same context, meaning any recess or opening in an upper side of the medium, the recess or opening being suitable for receiving, storing and containing an electronic device.

For example, the input medium and/or the output medium can be a JEDEC/EIAJ tray, i. e., built according to JEDEC (Joint Electron Devices Engineering Council) standard. In addition, the input medium and/or the output medium can be a molded matrix carrier for said electronic devices. A matrix with a plurality of compartments is formed in an upper side of the medium, so that a single compartment of the medium can receive and store at least a single electronic device. An X-Y coordinate system is assigned to the medium. A medium is defined by a theoretical model like a CAD (Computer Aided Design) data model which comprise target (theoretical) dimensions with tolerances: number of rows of compartments in the matrix, number of columns of compartments in the matrix, X- and Y-offset of the first compartment of the medium with respect to the edge of the medium, and pitch (dX, dY) between the compartments. However, the real dimensions of such a medium can vary over time, influenced by handling, temperature, batch or even supplier, etc.

For example, the input medium and/or the output medium can be a tape which is a flexible carrier with a linear array or a matrix of a plurality compartments for said electronic devices. Analogously to the tray; the same or another X-Y coordinate system is assigned to the tape, and the tape is defined by its CAD data which comprise target dimensions with tolerances: width, length, height, pitch, and F-value according to EIAJ (Electronic Industries Association of Japan) specification.

In order to place an electronic device correctly and well-aligned in a compartment of an output medium, the pick and place device has to 1) pick-up the electronic device from a defined known position on the electronic device, for example on the center of the electronic device, and
2) transfer and place the electronic device in a compartment of the output medium where the position of the compartment in the output medium and the dimensions of the electronic device have to be known.

Ideally these positions can be taught once for all media of the same kind. In practice, however, there are several tolerances that require re-calibration. The two main tolerances are due to variations in handling and variations between media. By design, the latter tolerance is the more important one: media like trays can have variations of up to 1 mm. One of the reasons for these variations are that media are exposed to large temperature variations. They are heated up and cooled down while clamped on a holding device or stage.

Therefore, the general purpose is to re-calibrate the pick-up positions of a pick and place device for each new input medium such that the pick and place device can pick-up electronic devices from a defined known position on the electronic device placed in compartments of the respective input medium and then transfer the electronic devices to compartments in an output medium.

Depending on the required precision, two known different methods are used for solving above problem.

As to the first known method, in case the size of the compartment tolerance of the output medium (e. g., tape) is sufficiently larger than the compartment tolerance of the input medium (e. g., tray), only the fixed CAD data defined in the handler model is used. In this case, misalignment due to variations from one input medium to another is not an issue, because said sufficiently larger compartments of the output medium offer sufficient space for receiving and storing said relatively small electronic devices.

As to the second known method in the other case, if the difference between the size of the compartment and the size of the electronic device is small, precise alignment is required. This is done by visional alignment (VA) on electronic devices, i. e. mechanical alignment by using vision methodology on electronic devices. Here, the electronic device is picked-up from a compartment of the input medium and then transferred to a machine vision based inspection device in order to determine the position, or position data respectively, of the electronic device with respect to the pick and place device. This information is then used to align the electronic device correctly to a compartment of an output medium and drop or place the electronic device into said compartment of the output medium.

Often not only one but several electronic devices are simultaneously picked-up in parallel from parallel compartments of an input medium and simultaneously placed in parallel into parallel compartments of an output medium. Also here, VA is used to calculate an optimal correction such that no misplacement occurs.

While the VA approach is precise and reliable its disadvantage is that it is rather slow. Each electronic device needs to be transferred to an inspection device, or the inspection device needs to be transferred to the electronic device. Then the respective electronic device is measured there. Often not only one but several electronic devices are simultaneously transferred to an inspection device with a corresponding number of cameras (or to a corresponding number of inspection devices with a single camera respectively) and simultaneously inspected.

By VA inspecting the respective electronic devices of the respective medium in respective image fields of view of respective inspection device(s), actual, i. e., corrected, position data of the respective compartments of the input medium are determined before the respective electronic devices are placed in respective compartments of an output medium. However, inspecting each electronic device of the input medium extremely lengthens the process of transferring the electronic devices from the input medium to the output medium, particularly, if the throughout requirements of units (electronic devices) per hour are high, for example for throughout requirements of more than 20 000 units per hour.

In addition, VA disadvantageously does not guarantee a centered pick-up of the electronic device from the respective compartment of an input medium, whereby the term "centered pick-up" refers to the center of the respective compartment of the input medium.

Other effects, like when electronic devices are blown-off the center of the compartment of the input medium, have impact on the drop or placement behavior of electronic devices and may result in an inferior drop or placement in respective compartments of an output medium, i. e., in a higher possibility for misplacement of the electronic devices in the respective compartments of the output medium, even if an VA inspection has been carried out before.

With VA inspection the speed penalty becomes too large, even if the at least one inspection device is located near the input medium. However, without VA it is often hardly possible to use different input media without manually adjusting the CAD data of the input medium in the handler model (third method). The latter method has an even larger speed penalty.

For the moment there are two different techniques for the transfer of electronic devices from an input medium to an output medium:
1) blind transfers using only the CAD data of the input medium: This advantageously results in a basic flow of transfers and no speed penalty; however, blind transfers disadvantageously result in low precision and/or low complexity; and
2) VA: two-dimensional (2D) corrections and rotation correction for each electronic device separately, if necessary: This disadvantageously results in a slow or interrupted flow of transfers and high speed penalty; however, VA advantageously results in high complexity.

Above term "complexity" refers to the density of packaged electronic devices, the smallness of compartments or electronic devices, respectively, and the number of compartments or electronic devices, respectively, in a medium. The smaller the electronic devices are and the denser the electronic devices are packed in correspondingly small and dense compartments of the medium, the higher is the number of electronic devices packable in the medium and the more complex are the medium dimensions and the requirements for a safe and precise pick-up, transfer and placement of the electronic devices.

In summary, advantages of the VA approach correspond with disadvantages of the blind transfer and adjusting-CAD-data approaches, whereas disadvantages of the VA approach correspond with advantages of the other said two approaches. Hence, there is a long-felt need to overcome, or at least reduce, the disadvantages of said three approaches.

U.S. Pat. No. 6,449,531 B1 discloses a method and an apparatus for transferring packaged integrated circuits from one JEDEC standard tray to another without manual handling of the ICs. Embodiments include a pick and place system for transferring ICs from a first tray to a second tray, motor drivers and a head for picking-up and placing the ICs by vacuum. The pick and place system is controlled by a processor that receives instructions from an input device. A first tray of ICs to be batched and a second tray to which the ICs are to be transferred are brought to the system. The operator enters data relating to the package to be transferred, the quantity of devices to be transferred, and the positions of the devices in the trays. The processor then controls the pick and place system to transfer the inputted quantity of devices from the first to the second tray based on the device positional information entered by the operator. Since there is no manual handling of the ICs, damage to the devices, such as bent leads, is eliminated, as is misorientation and miscounting of devices. Said method and said apparatus do not use VA and inspection devices.

U.S. patent application U.S. 2009/035119 A1 discloses a handling mechanism of trays with which electronic parts are fed and inspection device of the electronic parts using the mechanism. Through the provision of a tray placing rack for storing trays in multi steps, the trays accommodating electronic parts after inspection are received in the racks and through the provision of a tray stacking rack above the tray placing rack, an empty tray emptied by having been inspected of the electronic parts before inspection at an inspection stage is stacked on the tray stacking rack. When a certain tray is filled with electronic parts after inspection and is discharged, an empty tray is taken out from the tray stacking rack and the empty tray is fed to the rack position of the discharged tray to permit re-use of empty trays. Said method and said apparatus also do not use VA and inspection devices.

DISCLOSURE OF INVENTION

It is therefore an object of the present invention to provide a method for positioning electronic devices into compartments of an input medium which method enables a sufficiently fast flow of electronic devices and a sufficiently accurate picking-up of the electronic devices from the input medium.

The above object is achieved by a method for positioning electronic devices into compartments of an input medium, the method comprising the following steps:
  imaging N actual known positions by at least one inspection device, whereby the N known positions are formed on an upper side of the input medium, and N being greater or equal to two;
  determining actual position data of the N known positions from the images of the N known positions in a coordinate system assigned to the input medium;

calculating actual difference position data for each of the N known positions from the actual position data of the N known positions and from given target position data of the N known positions;

calculating actual position data of the compartments of the input medium from the given target position data of the compartments of the input medium and from the actual difference position data of the N known positions; and controlling a pick and place device on the basis of the actual position data of the compartments of the input medium.

Thus, the inventive method also uses vision alignment, but in an inventive and modified way. According to the invention, VA is exclusively used on the respective medium (e. g., tray or tape) and does not consider the electronic devices on said medium. The inventive method allows the calculation of the actual positions of compartments containing the electronic devices, although the exact locations of the electronic devices in the compartments are not known because of the above mentioned tolerances. However, the actual positions of compartments provide very good approximations for the locations of the electronic devices.

It is a further object of the present invention to provide an arrangement for positioning a plurality of electronic devices into compartments, whereby the arrangement enables sufficiently fast flow of electronic device transfers and provides sufficient precision in picking-up electronic devices from the compartments of an input medium.

The above object is achieved by an arrangement for positioning a plurality of electronic devices, the arrangement comprising:

at least one inspection device for imaging N actual known positions on an input medium, N being greater or equal to two;

a moving means for providing a relative motion between the at least one inspection device and the input medium in order to place at least one of the N known positions in an image field of view of the at least one inspection device;

at least one pick and place device for picking-up at least one electronic device from a respective at least one compartment of the input medium; and a control unit for determining actual position data of the compartments of the input medium, and for controlling the at least one pick and place device so that the electronic devices are correctly picked-up from the compartments of the input medium.

It is still a further object of the present invention to provide an arrangement for positioning a plurality of electronic devices from compartments of an input medium into compartments of an output medium, whereby the arrangement enables sufficiently fast flow of electronic device transfers as well as an exact picking-up and transfer of the electronic devices to the compartments of the output medium.

The above object is achieved by an arrangement for positioning a plurality of electronic devices from compartments of an input medium into compartments of an output medium, the arrangement comprising:

at least one inspection device for imaging N actual known positions on the input medium and M known positions on the output medium, N and M being greater or equal to two;

a moving means for providing a relative motion between the at least one inspection device and the input medium in order to place at least one of the N known positions on the input medium in an image field of view of the at least one inspection device, and for providing a relative motion between the at least one inspection device and the output medium in order to place at least one of the M known positions on the output medium in the image field of view of the at least one inspection device;

at least one pick and place device for picking-up at least one electronic device from a respective at least one compartment of the input medium, transferring the at least one electronic device to a respective at least one compartment of the output medium, and placing the at least one electronic device into the respective at least one compartment of the output medium; and a control unit for determining actual position data of the compartments of the input medium, for determining actual position data of the compartments of the output medium, and for controlling the at least one pick and place device and the at least one inspection device so that the electronic devices are correctly picked-up from the compartments of the input medium, correctly transferred to the compartments of the output medium and correctly placed into the compartments of the output medium.

As described above, in the specific embodiment of taping a tray, the input medium is a tray and the output medium is a tape in the above described inventive methods and inventive arrangements. It is clear however for a skilled person in the art that the input and output media can be any kind of medium or arrangement of compartments suitable for receiving, storing and containing electronic devices.

In the following, the term "transfer process" means the process of transferring electronic devices from compartments of an input medium to compartments of an output medium including the inspection and imaging processes by the at least one inspection device.

In one embodiment the inventive method the following steps are comprised: In a first step, N known positions are imaged by at least one inspection device, whereby the N known positions are formed on an upper side of the input medium in a plane defined by the upper side of the input medium. N is greater or equal to two. As described above, not only one but several inspection devices can be used to simultaneously inspect a corresponding number of known positions with a corresponding number of cameras, said number being less than N or equal to N (or one inspection device with a corresponding number of cameras can be used). In a next step, actual position data of the N known positions are determined from the images of the N known positions in a coordinate system assigned to the input medium. In a next step, actual difference position data for each of the N known positions are calculated from the actual position data of the N known positions and from given target position data of the N known positions. In a next step, actual position data of the compartments of the input medium are calculated from the given target position data of the compartments of the input medium and from the actual difference position data of the N known positions. In a last step, a pick and place device is controlled on the basis of the calculated actual position data of the compartments of the input medium. Hereby, the actual position data represent corrected position data relevant for a well-aligned picking-up of the electronic devices from the compartments of the input medium by the pick and place device.

Since the number N of known positions on the input medium may be chosen as a number being significantly less than the number of compartments of the input medium, the time-consuming process of inspection by the at least inspection device is carried out only for a few, namely N, known positions on the input medium, not for each of the significantly higher number of compartments of the input medium as in the VA approach. For example, N may be chosen as an integer number between 2 and 4. As an advantageous consequence of the inventive method, the time for the inspection process during the transfer process (e.g, when taping a tray) can be significantly reduced by choosing a sufficiently small number N. As already mentioned above, any number larger than 2 can be chosen. Nevertheless, the time advantage, compared to VA, becomes smaller and smaller as this number N becomes higher.

In a further embodiment of the inventive method, the target position data of the compartments of the input medium are updated according to the calculated actual position data of the compartments of the input medium during or after the step of calculating the actual position data of the compartments of the input medium. Thus for a specific type of input medium, the target position data can be improved step by step after each transfer process using this specific type of input medium and according to the actual environment of the transfer processes, thereby eliminating above described influences by handling, temperature, batch, or suppliers.

In a further embodiment of the inventive method, the target position data of the N known positions and the target position data of the compartments of the input medium are available in a Computer Aided Design (CAD) data model. The CAD data model may also be improved by above described updating of target position data of the compartments of the input medium.

In a further embodiment of the inventive method, the pick and place device picks-up at least one electronic device from a respective at least one compartment of the input medium and transfers the at least one electronic device to a respective at least one compartment of an output medium and places the at least one electronic device into the respective at least one compartment of the output medium, thereby carrying out the complete process of transferring the at least one electronic device from the input medium to the output medium. Hereby, actual position data of the respective at least one compartment of the output medium are communicated to the pick and place device to achieve a well-aligned placement of the electronic devices in the compartments of the output medium by the pick and place device.

Preferably and for saving even more time, at least two electronic devices are simultaneously picked-up in parallel from respective compartments of the input medium and are simultaneously transferred in parallel to respective compartments of the output medium and are placed in parallel into the respective compartments of the output medium.

In a further embodiment of the inventive method, the actual positions of the compartments of the output medium are determined in an analogous way to above described method for positioning electronic devices into compartments of an input medium. Therefore, the steps with regard to method embodiment for the output medium are not described in detail here, but only the differences are described in the following. M (instead of N) known positions on an upper side of the output medium in a plane defined by the upper side of the output medium are imaged by at least one inspection device. M is a number chosen greater or equal to two. In addition, M may be chosen equal to N or different from N. However, for the same reasons as described above with regard to the choice of N, M should be chosen significantly less than the number of compartments of the output medium. The coordinate system assigned to the output medium can be the same as the coordinate system assigned to the input medium or it can be a different coordinate system. The at least one inspection device for imaging the M known positions on the upper side of the output medium can be the same as the at least one inspection device for the N known positions on the upper side of the input medium, or it can be a different at least one inspection device. After having determined or calculated the actual position data of the M known positions from the images of the M known positions, the actual difference position data of the M known positions and the actual position data of the compartments of the output medium, then the pick and place device is controlled on the basis of the actual position data of the compartments of the output medium.

In addition or alternatively to the method embodiment for the output medium, the output medium (output medium dimensions) can be measured, and the output medium layout can automatically be adjusted before placing the electronic devices into the compartments of the output medium. The step of automatically adjusting the output medium layout can be carried out by teaching a template on the output medium and inspecting to determine the exact position of the template on the output medium. Also the transfer position of the output medium can automatically be adjusted before placing the electronic devices into the compartments of the output medium.

In one embodiment the inventive arrangement for positioning a plurality of electronic devices in compartments of an input medium, the arrangement comprises at least one inspection device for imaging N actual known positions on the input medium, N being greater or equal to two. The arrangement further comprises a moving means for providing a relative motion between the at least one inspection device and the input medium in order to place at least one of the N known positions in an image field of view of the at least one inspection device, at least one pick and place device for picking-up at least one electronic device from a respective at least one compartment of the input medium, and a control unit for determining actual position data of the compartments of the input medium, and for controlling the at least one pick and place device so that the electronic devices are correctly picked-up from the compartments of the input medium.

The input medium comprises a plurality of compartments, wherein a single compartment of the input medium can receive and store at least a single electronic device. N known positions are formed on the upper side of the input medium. Each of the N known positions is detectable by the at least one inspection device when the electronic devices are stored in the compartments of the input medium.

The control unit of the arrangement determines the actual position data of the compartments of the input medium on the basis of images of the N known positions of the input medium, the target position data of the N known positions and the target position data of the compartments of the input medium. Hereby, the N known positions are imaged by the at least one inspection device.

The input medium may be defined by a CAD data model which is connected to the control unit. In particular, the CAD data model can be a part of the control unit. The CAD data model comprises the target position data of the N known positions on the input medium and the target position data of the compartments of the input medium.

In another inventive arrangement the actual positions of compartments of an input medium for positioning a plurality of electronic devices as well as the actual positions of compartments of an output medium for positioning a plurality of electronic devices are determined. This arrangement is analogously built to the arrangement and its embodiments as described before. All relevant features have been described before, in particular with regard to the embodiment of the method using an input medium and an output medium. Therefore, this other inventive arrangement is not described in detail here.

The control unit of this other inventive arrangement determines the actual position data of the compartments of the output medium on the basis of images of the M known positions on the output medium, the target position data of the M known positions and the target position data of the compartments of the output medium. Hereby, the M known positions are imaged by the at least one inspection device.

The other arrangement may comprise a CAD data model being connected to the control unit, in particular, being part of the control unit. The CAD data model comprises the target position data of the N known positions on the input medium, the target position data of the compartments of the input medium, the target position data of the M known positions on the output medium, and the target position data of the compartments of the output medium.

The known positions on the input medium and/or output medium can be already applied or integrated during the production process of the input medium and/or output medium, for example, dots, lines, rectangles, crosses or other forms and/or functional structures on the upper side of the input medium and/or output medium and outside the compartments of the input medium and/or output medium. Alternatively or in addition, at least one of the known positions on the input medium and/or output medium may be a marking applied or formed afterwards to the upper side of the input medium and/or output medium at locations as described before. In each case, the known positions should be detectable by the at least one inspection device.

Advantageous embodiments of the invention are defined in the dependent claims and the following description.

BRIEF DESCRIPTION OF THE DRAWINGS

The nature and mode of operation of the present invention will now be more fully described in the following detailed description of the invention taken with the accompanying drawing figures, in which.

DETAILED DESCRIPTION OF THE INVENTION

Figure 1:
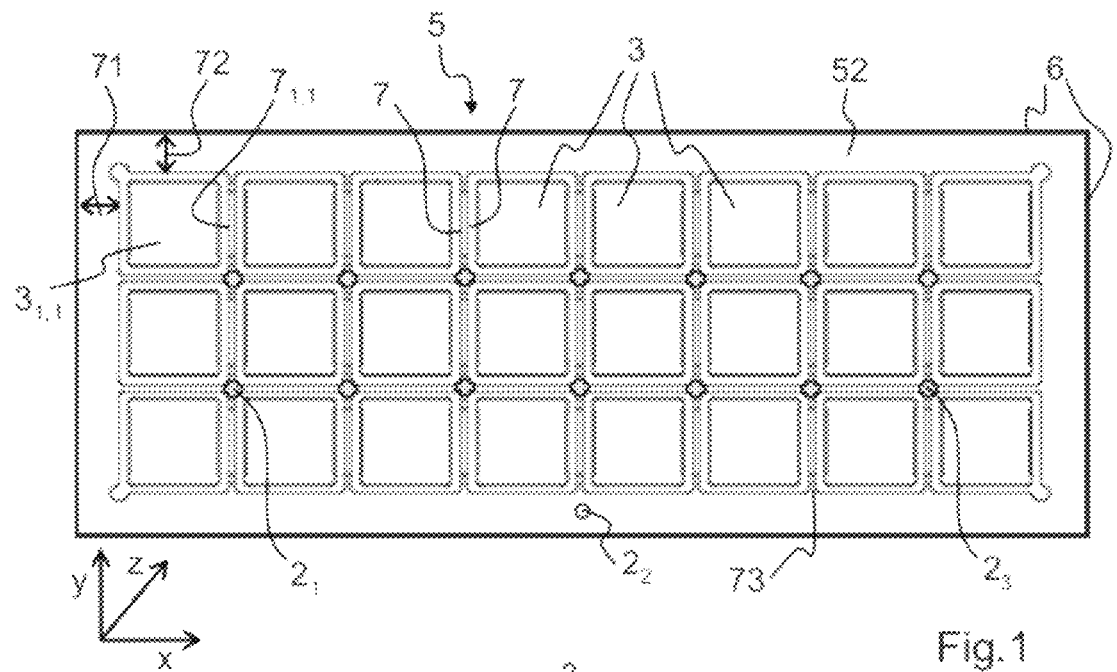
FIG. 1 is a schematic top view of a tray as an input medium, whereby known positions on the input medium are used for the inventive method or inventive arrangement.

Further features, objects and advantages of the present invention will be explained in the following detailed description of preferred embodiments of the invention, which serve as non-limiting examples and refer to the accompanying drawings. While the present invention is described with respect to what is presently considered to be the preferred aspects, it is to be understood that the invention as claimed is not limited to the disclosed aspects. Equal elements basically have the same reference numerals and repeated explanations are sometimes omitted.

Furthermore, it is understood that this invention is not limited to the particular methodology, materials and modifications described and as such may, of course, vary. It is also understood that the terminology used herein is for the purpose of describing particular aspects only, and is not intended to limit the scope of the present invention, which is limited only by the appended claims. Unless defined otherwise, all technical and scientific terms used herein have the same meaning as commonly understood to one of ordinary skill in the art to which this invention belongs. Although any methods or arrangements similar or equivalent to those described herein can be used in the practice or testing of the invention, the preferred methods and arrangements are now described.

Figure 4:
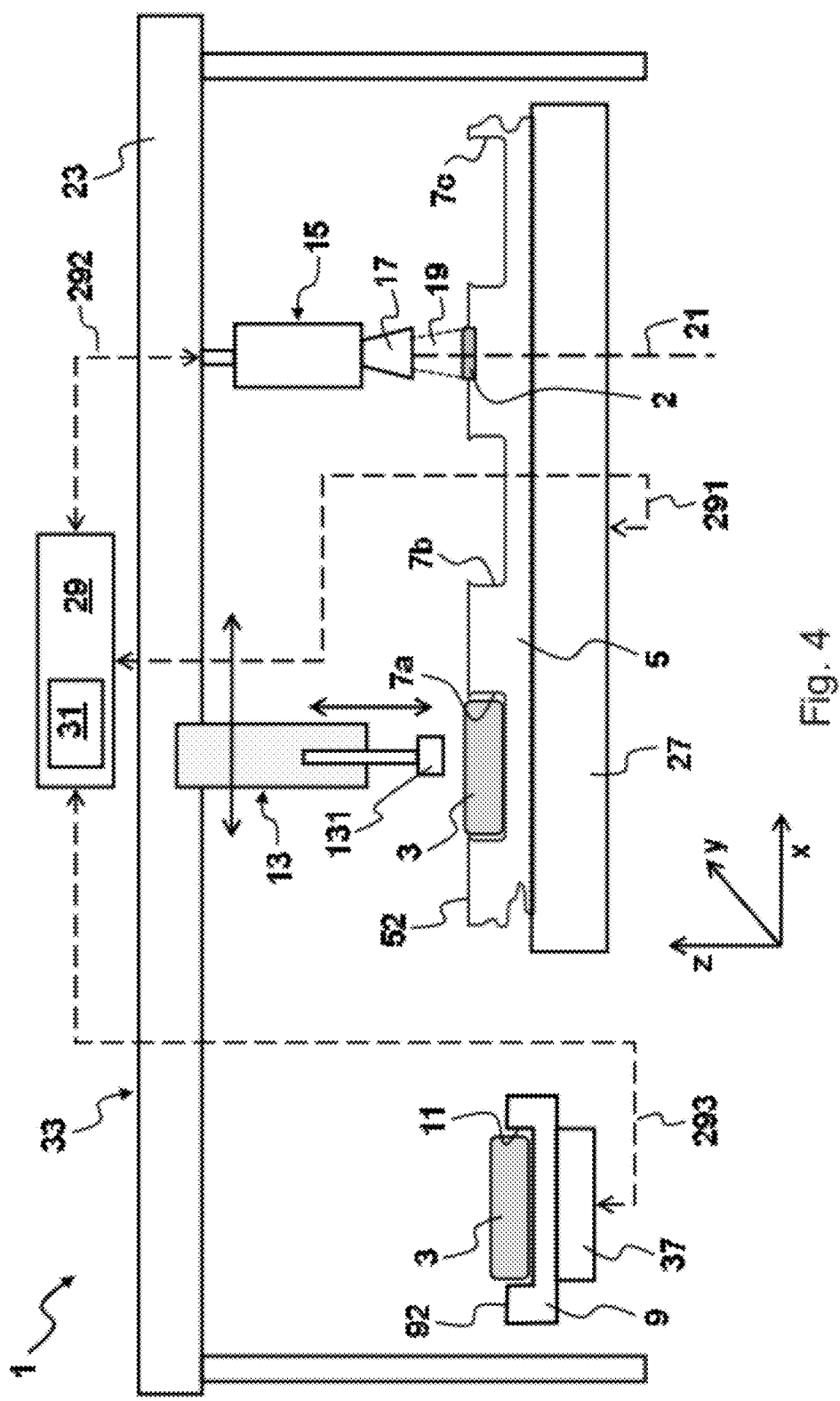
FIG. 4 is a schematic view of an embodiment of the inventive arrangement for transferring an electronic device from a compartment of an input medium to a compartment of an output medium.

FIG. 1 is a schematic top view of an embodiment of a tray as an input medium 5, whereby known positions $2_1, 2_2, 2_3$ on input medium 5 are used for the inventive method or inventive arrangement 1 (see FIG. 4).

Input medium 5 comprises a plurality of compartments 7. Each compartment 7 is formed in an upper side 52 of input medium 5, so that a single compartment I of the input medium 5 can receive and store at least a single electronic device 3. According to the view of FIG. 1, all compartments 7 contain electronic devices 3.

A coordinate system is assigned to input medium 5, whereby the main plane with the compartments 7 of input medium 5 is spanned by the X- and Y-directions, and the depth of input medium 5 is orientated in the Z-direction. The compartments 7 are arranged in matrix form. First electronic device $3_{1,1}$ is arranged in first compartment $7_{1,1}$ in this matrix. Reference numeral 71 stands for the offset from edge 6 of input medium 5 to the first compartment $7_{1,1}$ of input medium 5 in X-direction. Reference numeral 72 stands for the offset from edge 6 of input medium 5 to the first compartment $7_{1,1}$ of input medium 5 in Y-direction.

As described above, next to other data like number of rows of compartments 7 in the matrix and number of columns of compartments 7 in the matrix, also the X-offset 71, the Y-offset 72 and the pitch 73 (distance) between two neighbored compartments 7 can be available (stored) in a CAD data model being connected to a control unit 29 (see FIG. 4).

According to an embodiment of the invention, in the middle of each quadruple square of neighbored compartments 7 a cross structure is formed in the upper side 52 of input medium 5. The cross structures were applied, integrated or formed during the production process of input medium 5 and are detectable by the at least one inspection device 15 (see FIG. 4; in the following, for simplification of description, only one inspection device 15 is referred to). Therefore, input medium 5 is suitable for being used in the inventive method or inventive arrangement 1 (see FIG. 4), since said cross structures are considered as known positions 2 for the inventive method and inventive arrangement 1. However and as described before, not all but only a few, here two, cross structures are used as known positions $2_1$ and $2_3$ for being imaged measured according to the invention. In addition, another marking in the form of a circle on edge 6 of input medium 5 is used as known position $2_2$. Therefore in this case, the number of known positions 2 is three (N=3). In case two or more known positions 2 are used for the measurement process one can determine a 2-dimensional deviation of input medium 5 from the target data. The corrections are 2-dimensional (X-Y). If more than two known positions 2 are used, additional information like rotation of the inner matrix with respect to the input medium body can also be calculated. If even more known positions 2 are used, a least square fit will be calculated to get the best fit for the parameters describing the medium (e. g., X, Y, dX, dY and angle for a tray).

It is clear for a skilled person that the known position 2 can take various shapes. Any known position 2 can be used, even the center of a compartment 7 can be used, in which case fiducials like for example crosses or lines etc. around the electronic device 3 can be used.

Only these few known positions $2_1$, $2_2$, $2_3$ are imaged and there is no need to image all electronic devices 3 or all positions (i. e., cross structures in this case) of input medium 5. Due to the low number N=3 of inspection steps the time for the complete inspection process by the inspection device 15 during the transfer process is significantly reduced, since the number N=3 of known positions $2_1$, $2_2$, $2_3$ is significantly less than the number of electronic devices 3 in input medium 5 which would be imaged when using prior art approach VA.

It is conceivable for someone skilled in the art that the known positions 2 may be other structures and/or forms and/or forms markings than crosses, for example, dots, lines, rectangles, or any other forms and/or functional structures on the upper side 52 of input medium 5 which are detectable by the inspection device 15. Since the known positions 2 should be detectable even when electronic devices 3 are placed or stored in the compartments 7, the known positions 2 should be located outside the compartments 7. Usually, the known positions 2 are located near edge 6 of input medium 5 and/or between neighbored compartments 7 of input medium 5.

Figure 2:
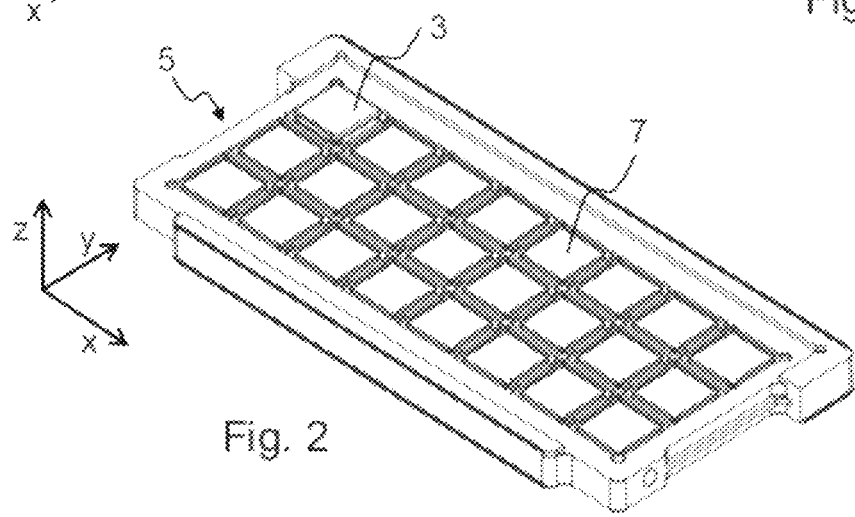
FIG. 2 is a schematic perspective view of the input medium according to FIG. 1.

FIG. 2 is a schematic perspective view of input medium 5 (tray) according to FIG. 1. According to FIG. 2, only one electronic device 3 is placed or stored in a respective compartment 7. All other compartments 7 are empty, since the respective other electronic devices 3 have been picked-up and transferred to an output medium 9 (see FIG. 3).

Figure 3:
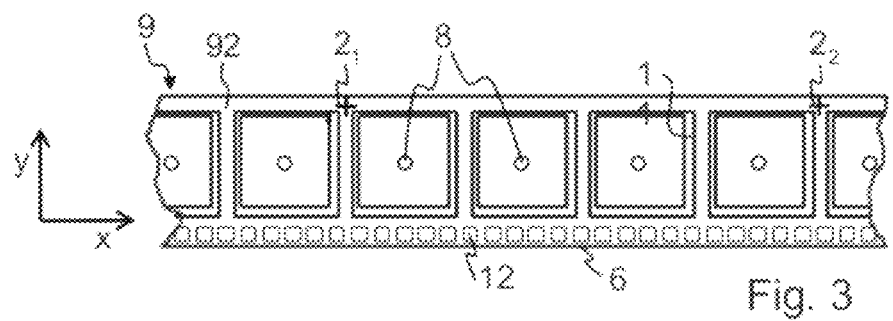
FIG. 3 is a schematic partial top view of an extract of an area around the edge of a tape as an output medium.

FIG. 3 is a schematic partial top view of an embodiment of a tape as an output medium 9 used with the present invention. Similarly to input medium 5 of FIG. 1, output medium 9 also has a matrix of a plurality of compartments 11 formed in the upper side 92 of output medium 9 (only one line of compartments 11 is shown here). In the shown embodiment of output medium 9, each compartment 11 has a hole 8 formed in the center of the respective compartment 11.

During the transfer process, electronic devices 3 are picked-up from the compartments 7 of input medium 5 (see FIGS. 1 to 2) and then transferred to output medium 9 and placed into the compartments 11 of output medium 9.

As described above, in order to place an electronic device 3 correctly and well-aligned in a compartment 11 of output medium 9, the at least one pick and place device 13 (see FIG. 4; in the following, for simplification of description, only one pick and place device 13 is referred to) picks-up the electronic device 3 and places the electronic device 3 in a defined compartment 11 of output medium 9.

Similarly to input medium 5 of FIG. 1, output medium 9 also has known positions $2_1$, $2_2$ on the upper side 92 and outside the compartments 11 of output medium 9. Normally, output medium 9 is stored on a reel (not shown) and is rolled-off form the reel for the transfer process. In order to monitor the transfer process efficiently, at least two known positions 2 on output medium 9 should be detectable by inspection device 15. Since compartments 11 of output medium 9 are empty before the transfer, also fiducials, for example holes 8 in inside the compartments 11 can be used. It is clear that the number M of the known positions 2 on output medium 9 needs to be at least two. Again, at least two, cross lines are used as known positions $2_1$ and $2_2$ for being imaged and measured according to a specific embodiment of the inventive method and according to a specific embodiment of the inventive arrangement 1 (see FIG. 4). As also described above, the known positions $2_1$ and $2_2$ on output medium 9 can be of any other structure and/or form and/or being detectable by inspection device 15.

In addition to input medium 5, output medium 9 comprises a line of regular holes 12 next to edge 6 of output medium 9. The opposite edge 6, which is not shown in the enlarged view of output medium 9 according to FIG. 3, may also comprise a line of holes 12. These holes 12 near the edges 6 are provided for transporting output medium 9 by a transport device 37 (see FIG. 4). Transport device 37 comprises engaging elements which engage with the holes 12 of output medium 9 in order to transport output medium 9.

FIG. 4 is a schematic view of an embodiment of the inventive arrangement 1 for positioning electronic devices from an input medium 5 into compartments 11 of output medium 9. The actual positions of compartments 7a, 7b, 7c of an input medium 5 are used for positioning a plurality of electronic devices 3. Arrangement 1 comprises at least one inspection device 15 (in the following, for simplification of description, only one inspection device 15 is referred to), for example a camera 15 with an objective 17 for imaging N actual known positions (see FIG. 1) on the input medium 5. N is greater or equal to two.

In order to provide a relative motion between input medium 5 and inspection device 15 a moving means 23 is provided. With the moving means 23 the inspection device 15 is transported to at least one of the N known positions 2 (see FIG. 1) so that the respective known position 2 is in an inspection position 21 and in an image field of view 19 of the at least one inspection device 15. Said relative motion can be described with respect to an X, Y, Z-coordinate system assigned to input medium 5.

According to a further embodiment, input medium 5 is placed on stage 27. Dependent on the kind of relative motion, input medium 5 is either movable relative to stage 27 in order to place the respective known positions 2 in the image field of view 19 of inspection device 15 (not shown in FIG. 4; in this case, moving means 23 is assigned to or comprised in stage 27), or input medium 5 is placed unmovable on stage 27 according to the embodiment of FIG. 4. In the latter case, inspection device 15 is moved to the respective known positions 2 by said moving means 23.

Same moving means 23 or a further moving means can be used for providing a relative motion between inspection device 15 and output medium 9 in order to place at least one of the M known positions 2 on output medium 9 in the image field of view 19 of inspection device 15.

Arrangement 1 also comprises at least one pick and place device 13 (in the following, for simplification of description, only one pick and place device 13 is referred to) for picking-up at least one electronic device 3 from a respective at least one compartment 7a, 7b, 7c of input medium 5. Pick and place device 13 is controlled on the basis of actual position data of compartments 7a, 7b, 7c of input medium 5. Said actual position data of compartments 7a, 7b, 7c are calculated according to the inventive method (see FIG. 5).

Subsequently, pick and place device 13 transfers the respective electronic devices 3 from compartments 7a, 7b, 7c to respective compartments 11 of output medium 9 and places the picked-up and transferred electronic devices 3 into the compartments 11. In an embodiment of the inventive arrangement, actual position data of the respective at least one compartment 11 of output medium 9 are communicated to pick and place device 13.

According to an embodiment of the invention and in order to save time, at least two electronic devices 3 are simultaneously picked-up in parallel from respective compartments 7a, 7b, 7c of input medium 5 and are simultaneously transferred in parallel to and placed in parallel into respective compartments 11 of output medium 9. In this case, pick and place device 13 has to provide a corresponding number of pick and place elements 131. Alternatively, a corresponding number of pick and place devices 13 has to be provided, each pick and place device 13 comprising one single pick and place element 131.

Furthermore, arrangement 1 comprises a control unit 29 for determining actual position data (see FIG. 5) of the compartments 7a, 7b, 7c of input medium 5, and for controlling pick and place device 13, so that the electronic devices 3 are correctly picked-up from the compartments 7a, 7b, 7c of input medium 5. In particular, control unit 29 determines the actual position data of the compartments 7a, 7b, 7c of input medium 5 on the basis of images of the N known positions 2 on input medium 5, on the basis of target position data of the N known positions 2, and on the basis of target position data of the compartments 7a, 7b, 7c of input medium 5. Hereby, only the N known positions 2 on input medium 5 are imaged by inspection device 15.

In an enhanced embodiment, control unit 29 also determines actual position data (see FIG. 6) of compartments 11 of output medium 9 and controls pick and place device 13, so that the electronic devices 3 are correctly transferred to and correctly placed into compartments 11 of output medium 9. In particular, control unit 29 determines the actual position data of compartments 11 of output medium 9 on the basis of images of the M known positions 2 on output medium 9, on the basis of target position data of the M known positions 2, and on the basis of target position data of the compartments 11 of output medium 9. Hereby, only the M known positions 2 on output medium 9 are imaged by inspection device 15. Therefore, control unit 29 is linked by respective connections 291, 292, 293 to stage 27 with input medium 5 thereon, inspection device 15 and transport device 37 with output medium 9 thereon.

A CAD data model 31 is available to control unit 29. In particular, CAD data model 31 can be part of control unit 29 according to the embodiment as shown in FIG. 4. In a first embodiment, CAD data model 31 comprises and stores the target position data of the N known positions 2 on input medium 5 and the target position data of 7a, 7b, 7c of input medium 5. In an enhanced embodiment, CAD data model 31 comprises and stores the target position data of the M known positions 2 on output medium 9 and the target position data of compartments 11 of output medium 9, in addition.

A portal 33 provides support for moving and/or holding diverse elements of arrangement 1, for example, such elements as pick and place device 13 and inspection device 15, as shown in the embodiment of FIG. 4. With this arrangement, pick and place device 13 and inspection device 15 can move from input medium 5 to output medium 9 and vice versa.

Figure 5:
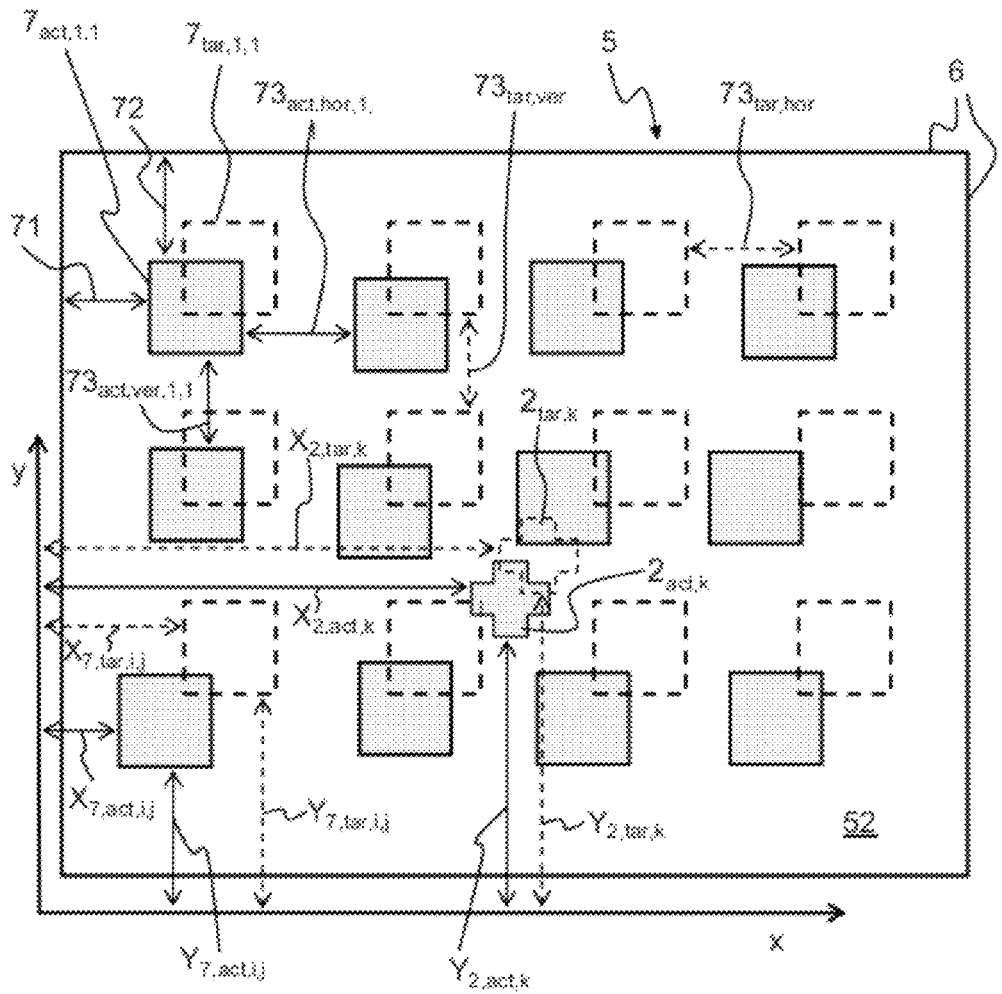
FIG. 5 is a schematic enlarged view of an embodiment of an input medium, the view showing the diverse position data as used and determined in the inventive method and inventive arrangement.

FIG. 5 is a schematic enlarged view of an embodiment of an input medium 5 (tray), the view showing the diverse actual and target position data as used or determined in the inventive method and inventive arrangement 1. For illustrating the inventive method, less compartments $7_{1,1}$ to $7_{3,4}$ with larger pitches 73 there between are shown in FIG. 5 than a real common input medium 5 has. All target positions are illustrated by dashed lines, and all actual positions are illustrated by continuous lines. An X-Y coordinate system is assigned to input medium 5.

All target compartments $7_{tar,i,j}$, whereby i=1 to 3 for rows and j=1 to 4 for columns in the compartment matrix, are well-aligned, i. e., they have the same horizontal pitches $73_{tar,hor}$ and the same vertical pitches $73_{tar,ver}$. As described above, the target position data of the target compartments $7_{tar,i,j}$ are corresponding X-coordinates $7_{tar,i,j}$ and Y-coordinates $Y_{7,tar,i,j}$ representing theoretical position data. However, these target position data $X_{7,tar,i,j}$ and Y-coordinates $Y_{7,tar,i,j}$ are often influenced by handling, temperature, batch or even supplier, etc., and therefore result in actual position data $X_{7,act,i,j}$ and Y-coordinates $Y_{7,act,i,j}$ of actual compartments $7_{act,i,j}$.

Completely analogously, all target known positions $2_{tar,k}$ of input medium 5, whereby k=1 to N, are well-aligned with respect to the target compartments $7_{tar,i,j}$. The target position data of the target known positions $2_{tar,k}$ are corresponding X-coordinates $X_{2,tar,k}$ and Y-coordinates $Y_{2,tar,k}$ representing theoretical position data. However, these target position data $X_{2,tar,k}$ and Y-coordinates $Y_{2,tar,k}$ are also often influenced, and therefore result in actual position data $X_{2,act,k}$ and Y-coordinates $Y_{2,act,k}$ of actual known positions $2_{act,k}$.

According to the inventive method, in a first step the N actual known positions $2_{act,k}$ on upper side 52 of input medium 5 are imaged by inspection device 15 (see FIG. 4).

In a next step, the actual position data $X_{2,act,k}$ and $Y_{2,act,k}$ of the N known positions $2_{tar,k}$ are determined from the images of the N known positions $2_{tar,k}$ in the X-Y coordinate system.

In a next step, actual difference position $X_{2,diff,k}$ and $Y_{2,diff,k}$ data are calculated for each of the N known positions $2_{tar,k}$ from the actual position data $X_{2,act,k}$ and $Y_{2,act,k}$ of the N known positions $2_{tar,k}$ and from given target position data $X_{2,tar,k}$ and $Y_{2,tar,k}$ of the N known positions $2_{tar,k}$:

$$X_{2,diff,k} = X_{2,act,k} - X_{2,tar,k} \quad (1)$$

$$Y_{2,diff,k} = Y_{2,act,k} - Y_{2,tar,k} \quad (2)$$

In a next step, for each i of matrix rows and each j of matrix columns, the actual position data $X_{7,act,i,j}$ and $Y_{7,act,i,j}$ of the actual compartments $7_{act,i,j}$ of input medium 5 are calculated from the respective given target position data $X_{7,tar,i,j}$ and $Y_{7,tar,i,j}$ and from the actual difference position data $X_{2,diff,k}$ and $Y_{2,diff,k}$ of the N known positions $2_k$:

$$X_{7,act,i,j} = f(X_{7,tar,i,j}; X_{2,diff,k=1\ldots N}; Y_{2,diff,k=1\ldots N}) \quad (3)$$

$$Y_{7,act,i,j} = -f(Y_{7,tar,i,j}; Y_{2,diff,k=1\ldots N}; Y_{2,diff,k=1\ldots N}) \quad (4)$$

In equations (3) and (4), f is a function of $X_{7,tar,i,j}$, $X_{2,diff,k=1\ldots N}$ and $Y_{2,diff,k=1\ldots N}$. Function f should take into account possible rotation of the input medium matrix inside input medium 5, if N is greater than 2. In case N>2, the correction for each actual position data $X_{2,diff,k}$ and $Y_{2,diff,k}$ depends on all differences of the parameters of function f.

Equations (3) and (4) can be calculated for a single k of a specific known positions $2_k$. Alternatively, equations (3) and (4) are calculated or more k's or even all k's, such that an average is to be calculated for each $X_{7,act,i,j}$ and $Y_{7,act,i,j}$ across the respective number of k's. In each case, pick and place device 13 is controlled on the basis of the calculated actual position data $X_{7,act,i,j}$ and $Y_{7,act,i,j}$ of compartments $7_{i,j}$ of input medium 5 with regard to a well-aligned picking-up the electronic devices 3 (see FIGS. 1 and 2) from the compartments $7_{i,j}$.

According to an embodiment of the inventive method, the target position data $X_{7,act,i,j}$ and $Y_{7,act,i,j}$ of the compartments $7_{i,j}$ of input medium 5 are updated according to the calculated actual position data $X_{7,act,i,j}$ and $Y_{7,act,i,j}$ of the compartments $7_{i,j}$ during or after step (3) and (4) of calculating the actual position data $X_{7,act,i,j}$ and $Y_{7,act,i,j}$.

Figure 6:
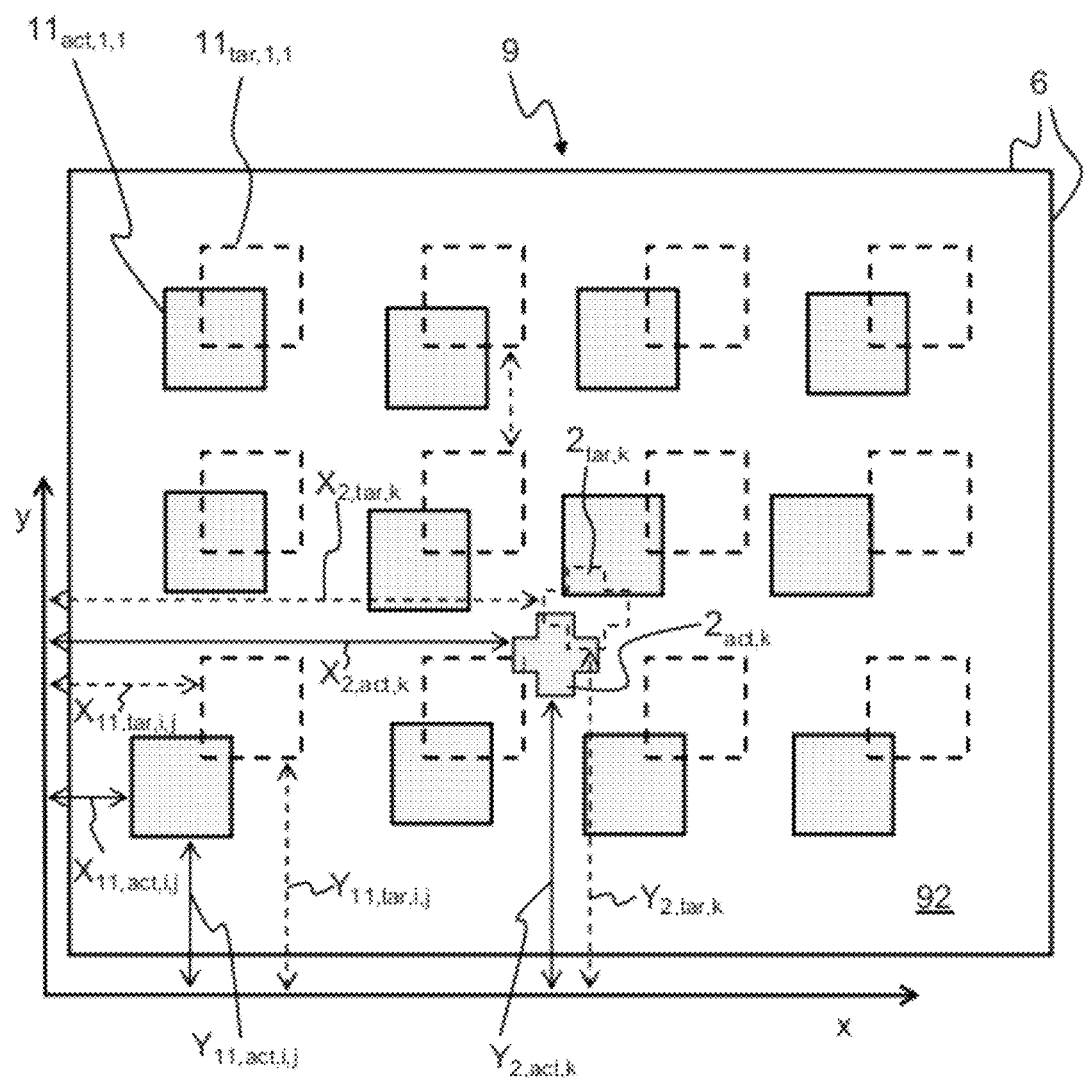
FIG. 6 is a schematic enlarged view of an embodiment of an output medium, the view showing the diverse position data as used and determined in the inventive method and inventive arrangement.

FIG. 6 is a schematic enlarged view of an embodiment of an output medium 9 (tape), the view showing the diverse actual and target position data as used or determined in an embodiment of the inventive method and inventive arrangement 1. For illustrating the inventive method, less compartments $11_{1,1}$ to $11_{3,4}$ with larger pitches there between are shown in FIG. 6 than a real common output medium 9 has. All target positions are illustrated by dashed lines, and all actual positions are illustrated by continuous lines. An X-Y coordinate system is assigned to output medium 9, the same as for input medium 5 or another one.

All target compartments $11_{tar,i,j}$, whereby i=1 to 3 for rows and j=1 to 4 for columns in the compartment matrix, are well-aligned, i. e., they have the same horizontal pitches and the same vertical pitches there between. As described above, the target position data of the target compartments $11_{tar,i,j}$ are corresponding X-coordinates $X_{11,tar,i,j}$ and Y-coordinates $Y_{11,tar,i,j}$ representing theoretical position data. However, these target position data $X_{11,tar,i,j}$ and Y-coordinates $Y_{11,tar,i,j}$ are often influenced, and therefore result in actual position data $X_{11,act,i,j}$ and Y-coordinates $Y_{11,act,i,j}$ of actual compartments $11_{act,i,j}$.

Completely analogously, all target known positions $2_{tar,k}$ of output medium 9, whereby k=1 to M, are well-aligned with respect to the target compartments $11_{tar,i,j}$. The target position data of the target known positions $2_{tar,k}$ are corresponding X-coordinates $X_{2,tar,k}$ and Y-coordinates $Y_{2,tar,k}$ representing theoretical position data. However, these target position data $X_{2,tar,k}$ and Y-coordinates $Y_{2,tar,k}$ are also often influenced, and therefore result in actual position data $X_{2,act,k}$ and Y-coordinates $Y_{2,act,k}$ of actual known positions $2_{act,k}$.

According to the inventive method, in a first step the M actual known positions $2_{act,k}$ on upper side 92 of output medium 9 are imaged by inspection device 15 (see FIG. 4).

In a next step, the actual position data $X_{2,act,k}$ and $Y_{2,act,k}$ of the M known positions $2_{tar,k}$ are determined from the images of the M known positions $2_{tar,k}$ in the X-Y coordinate system.

In a next step, actual difference position $X_{2,diff,k}$ and $Y_{2,diff,k}$ data are calculated for each of the M known positions $2_{tar,k}$ from the actual position data $X_{2,act,k}$ and $Y_{2,act,k}$ of the M known positions $2_{tar,k}$ on output medium 9 and from given target position data $X_{2,tar,k}$ and $Y_{2,tar,k}$ of the M known positions $2_{tar,k}$:

$$X_{2,diff,k} = X_{2,act,k} - X_{2,tar,k=1} \quad (5)$$

$$Y_{2,diff,k} = Y_{2,act,k} - Y_{2,tar,k=1} \quad (6)$$

In a next step, for each i of matrix rows and each j of matrix columns, the actual position data $X_{11,act,i,j}$ and $Y_{11,act,i,j}$ of the actual compartments $11_{act,i,j}$ of output medium 9 are calculated from the respective given target position data $X_{11,tar,i,j}$ and $Y_{11,tar,i,j}$ and from the actual difference position data $X_{2,diff,k}$ and $Y_{2,diff,k}$ of the M known positions $2_k$:

$$X_{11,act,i,j} = g(X_{11,tar,i,j}; X_{2,diff,k=1\ldots N}; Y_{2,diff,k=1\ldots N}) \quad (7)$$

$$Y_{11,act,i,j} = g(Y_{11,tar,i,j}; Y_{2,diff,k,k=1\ldots N}; Y_{2,diff,k=1\ldots N}) \quad (8)$$

g is a function similarly and analogously defined as function f in equations (3) and (4), taking also into account other parameters of output medium 9 like F, output medium pitch, iso X, Y, dX, dY, etc. Equations (7) and (8) can be calculated for a single k of a specific known position $2_k$ on output medium 9. Alternatively, equations (7) and (8) are calculated or more k's or even all k's, such that an average is to be calculated for each $X_{11,act,i,j}$ and $Y_{11,act,i,j}$ across the respective number of k's. In each case, pick and place device 13 is controlled on the basis of the calculated actual position data $X_{11,act,i,j}$ and $Y_{11,act,i,j}$ of compartments $11_{i,j}$ of output medium 9 with regard to a well-aligned transferring the electronic devices 3 (see FIG. 3) from compartments $7_{i,j}$ of input medium 5 to compartments $11_{i,j}$ of output medium 9, and with regard to a well-aligned placing the electronic devices 3 into the compartments $11_{i,j}$ of output medium 9.

According to an embodiment of the inventive method, the target position data $X_{11,tar,i,j}$ and $Y_{11,tar,i,j}$ of the compartments $11_{i,j}$ of output medium 9 are updated according to the calculated actual position data $X_{11,act,i,j}$ and $Y_{11,act,i,j}$ of the compartments $11_{i,j}$ during or after step (7) and (8) of calculating the actual position data $X_{11,act,i,j}$ and $Y_{11,act,i,j}$.

Finally, it should be noted in particular, that the previously described exemplary embodiments, only serve to describe the teachings claimed, and are not limiting to the exemplary embodiments. It is conceivable however for someone skilled in the art that variations and modifications of the invention can be made without departing from the scope of protection of the appended claims.

LIST OF REFERENCE NUMERALS 1 arrangement
$2_1, \ldots, 2_N$; known position
$2_1, \ldots, 2_M$
3, $3_{1,1}$ electronic device (electronic component)
5 input medium (tray; tape)
52 upper side of input medium
6 edge
7, $7_{i,j}$, 7a, 7b, 7c compartment of input medium
71 X-offset of the first compartment of input medium
72 Y-offset of the first compartment of input medium
73 pitch between two neighbored compartments
8 hole
9 output medium (tray; tape)
92 upper side of output medium
11, $11_{i,j}$ (compartment of output medium
12 hole
13 pick and place device
131 pick and place element
15 inspection device (camera)
17 objective
19 image field of view
21 inspection position
23 moving means
27 stage
29 control unit
291 connection
292 connection
293 connection
31 CAD data model
33 portal
37 transport device
N number of known positions (markings) on input medium
M number of known positions (markings) on output medium

What is claimed is:

1. A method for positioning electronic devices into compartments of an input medium, the method comprising the following steps:

imaging N actual known positions by at least one inspection device, whereby the N known positions are formed on an upper side of the input medium, and N being greater or equal to two;

determining actual position data of the N known positions from the images of the N known positions in a coordinate system assigned to the input medium;

calculating actual difference position data for each of the N known positions from the actual position data of the N known positions and from given target position data of the N known positions;

calculating actual position data of the compartments of the input medium from the given target position data of the compartments of the input medium and from the actual difference position data of the N known positions; and controlling a pick and place device on the basis of the actual position data of the compartments of the input medium.

2. The method as claimed in claim 1, wherein the target position data of the compartments of the input medium are updated according to the calculated actual position data of the compartments of the input medium during or after the step of calculating the actual position data of the compartments of the input medium.

3. The method as claimed in claim 1, wherein the target position data of the N known positions and the target position data of the compartments of the input medium are available in a Computer Aided Design (CAD) data model.

4. The method as claimed in claim 1, wherein the pick and place device picks-up at least one electronic device from a respective at least one compartment of the input medium and transfers the at least one electronic device to a respective at least one compartment of an output medium and places the at least one electronic device into the respective at least one compartment of the output medium, whereby actual position data of the respective at least one compartment of the output medium are communicated to the pick and place device.

5. The method as claimed in claim 4, wherein at least two electronic devices are simultaneously picked-up in parallel from respective compartments of the input medium and are simultaneously transferred in parallel to and placed in parallel into respective compartments of the output medium.

6. The method as claimed in claim 4, wherein the actual positions of the compartments of the output medium are determined by the following steps:

imaging M known positions by at least one inspection device, whereby the M known positions are formed on an upper side of the output medium, and M being greater or equal to two;

determining actual position data of the M known positions from the images of the M known positions in a coordinate system assigned to the output medium;

calculating actual difference position data for each of the M known positions from the actual position data of the M known positions and from given target position data of the M known positions;

calculating actual position data of the compartments of the output medium from the given target position data of the compartments of the output medium and from the actual difference position data of the M known positions; and controlling the pick and place device on the basis of the actual position data of the compartments of the output medium.

7. The method as claimed in claim 4, the method further comprising the step of measuring the output medium and automatically adjusting the output medium layout before placing the electronic devices into the compartments of the output medium.

8. The method as claimed in claim 7, wherein the step of automatically adjusting the output medium layout is carried out by teaching a template on the output medium and inspecting to determine the position of the template on the output medium.

9. The method as claimed in claim 6, the method further comprising the step of measuring the output medium and automatically adjusting the transfer position of the output medium before placing the electronic devices into the compartments of the output medium.

10. An arrangement for positioning a plurality of electronic devices, the arrangement comprising:

at least one inspection device for imaging N actual known positions on an input medium, N being greater or equal to two;

a moving means for providing a relative motion between the at least one inspection device and the input medium in order to place at least one of the N known positions in an image field of view of the at least one inspection device;

at least one pick and place device for picking-up at least one electronic device from a respective at least one compartment of the input medium; and a control unit for determining actual position data of the compartments of the input medium, and for controlling the at least one pick and place device so that the electronic devices are correctly picked-up from the compartments of the input medium.

11. The arrangement as claimed in claim 10, wherein the input medium comprises:

a plurality of compartments, each compartment being formed in an upper side of the input medium, so that a single compartment of the input medium can receive and store at least a single electronic device; and, N known positions on the upper side of the input medium, each of the N known positions being detectable by the at least one inspection device when the electronic devices are stored in the compartments of the input medium.

12. The arrangement as claimed in claim 11, wherein at least one of the N known positions on the input medium is a marking formed on the upper side of the input medium.

13. The arrangement as claimed in claim 10, wherein the control unit determines the actual position data of the compartments of the input medium on the basis of images of the N known positions, target position data of the N known positions of the input medium, and target position data of the compartments of the input medium, wherein the N known positions of the input medium are imaged by the at least one inspection device.

14. The arrangement as claimed in claim 13, wherein the arrangement comprises a CAD data model being connected to the control unit, the CAD data model comprising:

the target position data of the N known positions on the input medium; and the target position data of the compartments of the input medium.

15. An arrangement for positioning a plurality of electronic devices from compartments of an input medium into compartments of an output medium, the arrangement comprising:

at least one inspection device for imaging N actual known positions on the input medium and M known positions on the output medium, N and M being greater or equal to two;

a moving means for providing a relative motion between the at least one inspection device and the input medium in order to place at least one of the N known positions on the input medium in an image field of view of the at least one inspection device, and for providing a relative motion between the at least one inspection device and the output medium in order to place at least one of the M known positions on the output medium in the image field of view of the at least one inspection device;

at least one pick and place device for picking-up at least one electronic device from a respective at least one compartment of the input medium, transferring the at least one electronic device to a respective at least one compartment of the output medium, and placing the at least one electronic device into the respective at least one compartment of the output medium; and a control unit for determining actual position data of the compartments of the input medium, for determining actual position data of the compartments of the output medium, and for controlling the at least one pick and place device so that the electronic devices are correctly picked-up from the compartments of the input medium, correctly transferred to the compartments of the output medium and correctly placed into the compartments of the output medium.

16. The arrangement as claimed in claim 15, wherein at least one of the M known positions on the output medium is a marking formed on the upper side of the output medium.

17. The arrangement as claimed in claim 15, wherein the control unit determines the actual position data of the compartments of the output medium on the basis of images of the M known positions of the output medium, target position data of the M known positions, and target position data of the compartments of the output medium, wherein the M known positions are imaged by the at least one inspection device.

18. The arrangement as claimed in claim 17, wherein the arrangement comprises a CAD data model being connected to the control unit, the CAD data model comprising:

the target position data of the N known positions on the input medium;

the target position data of the compartments of the input medium;

the target position data of the M known positions on the output medium; and the target position data of the compartments of the output medium.

* * * * *